United States Patent [19]

Boler et al.

[11] 4,321,486
[45] Mar. 23, 1982

[54] PHOTODETECTOR SIGNAL CONTROL IN CHARGE TRANSFER DEVICE IMAGER

[75] Inventors: Clifford H. Boler, New Hope, Minn.; Dennis J. Wilwerding, Littleton, Colo.

[73] Assignee: Honeywell Inc., Minneapolis, Minn.

[21] Appl. No.: 123,636

[22] Filed: Feb. 22, 1980

[51] Int. Cl.³ .................... H03K 3/42; H01L 29/78; H01L 27/14; H01L 31/00
[52] U.S. Cl. ................................ 307/311; 357/24; 357/30
[58] Field of Search ............... 357/24, 30; 307/221 D, 307/311

[56] References Cited

U.S. PATENT DOCUMENTS

| | | | |
|---|---|---|---|
| 3,931,463 | 1/1976 | Levine | 357/24 |
| 3,944,816 | 3/1976 | Harada | 357/24 |
| 4,087,833 | 5/1978 | Tseng | 357/24 |
| 4,139,784 | 2/1979 | Sauer | 357/24 |
| 4,271,240 | 6/1981 | Chikamura et al. | 357/24 |

Primary Examiner—Gene M. Munson
Attorney, Agent, or Firm—Theodore F. Neils

[57] ABSTRACT

An electronic imager arrangement is provided in which the time duration for sensing radiation is established by determining the amount of radiation already sensed.

22 Claims, 5 Drawing Figures

PHOTODETECTOR SIGNAL CONTROL IN CHARGE TRANSFER DEVICE IMAGER

BACKGROUND OF THE INVENTION

The present invention relates to the control of photodetector signals, particularly signals from photodetectors which are used as sensors in receiving radiation passing through some portion of an imaging system. More particularly, the signals controlled in the present invention are specially connected with sensors for sampling electromagnetic radiation transmitted through the system optics.

The use of charge-transfer device technology to process signals obtained from photodetectors has a number of advantages. First, charge-transfer devices, particularly charge-coupled devices, can be relatively easily fabricated in silicon monolithic integrated circuits, and can be fabricated such that these devices individually are capable of being provided therein in a high density. The charge-transfer device with respect to analog signals, is basically a sampling device directly manipulating the analog samples. Thus, interface between such a device and the photodetector can be relatively uncomplicated since the photodetector, typically, provides an analog electrical output signal more or less related to that electromagnetic energy which has been sensed therein. Further, the analog samples to be manipulated in the charge-transfer device can be controlled by digital clocking circuits which permit considerable flexibility in treating the analog samples.

If charge-coupled device technology is to be used for processing the signals resulting from the photodetector, a very convenient photodetector to use is a conductor-insulator-semiconductor (CIS) detector which is essentially a capacitor. In such photodetectors, the semiconductor material supports an insulator which in turn supports the conductor, the side of the conductor opposite its insulator support being first exposed to impinging electromagnetic radiation of interest for detection. The conductor is an electrode which together with the insulator are of such a nature as to permit radiation to pass therethrough to reach the surface of the semiconductor material. With the voltage applied between the conductor serving as a photodetector electrode and the semiconductor material such as to form a depletion region in the semiconductor material, charges accumulate at the surface of the semiconductor material at the sensing site in proportion to the amount of radiation experienced at that semiconductor material surface. This radiation induced charge is accumulated and held at the semiconductor material surface at the sensing site for the time duration that voltage is maintained on the conductor because of the potential resulting at the semiconductor material surface due to this applied voltage. In a typical photodetector system, the conductor voltage is typically a repeated voltage pulse changing between zero voltage and some applied voltage level, as just indicated, with such a voltage pulse being provided to the conductor at each sensing site. Thereby, sampling is accomplished of the incoming radiation at various points across a phase surface thereof in the sampled data photodetector system.

However, there is a maximum amount of radiation induced charge accumulation that is desired at a sensing site, either because (i) the photodetector cannot accumulate any further charge at the sensing site for the voltage present there, or because, (ii) the charge-coupled device signal processing circuitry design can operate only with a certain maximum amount of accumulated charge in a period of time, i.e. a maximum size charge packet representing a sample in a sampling period. One possibility, then, would be to provide a fixed time duration for accumulating charge induced by radiation impinging at a sensing site in a sampling period. Such a procedure cannot always be relied on to prevent an overaccumulation of charge during a sampling period at a sensing site. This is because the intensity of the radiation impinging on the sensing site will often be unknown because the scene being imaged will usually have a substantial variety of radiation intensities thereacross which in many instances cannot be predicted, either as to the absolute intensity maximum that will occur or as to the locations of intensity maxima in the scene. Thus, the maximum amount of charge which will accumulate in a fixed time duration in a sample cannot always be predicted either, nor can the particular sensing site be predicted at which such a maximum sample will occur.

Another possibility would be to transfer the accumulated charge, or sample, from each sensing site into a sequential position in a charge-coupled device shift register and monitor the size of each charge packet as is transferred by a selected monitoring point. Then, the time duration could be varied depending on the size of the charge packets coming by the monitoring point. However, the result is that the charge packets do not have a maximum size selected for them during the sampling period the packet is being accumulated raising the possibility that too large a charge accumulation will occur during that sampling period before the monitor senses the situation. Further, the monitoring process takes additional time which can interfere with the photodetector signal processing insofar as limiting the rate of changes which can be sensed in the scene being imaged because of the limited time response of the photodetector signal processing system.

Thus, a photodetector signal system would be desirable in which the size of the charge packets occurring at the various sensing sites is controlled at the very time during which these charges are being accumulated. Further desired would be a photodetector signal processing system in which the charges accumulating in the packets of each sensing site would be simultaneously monitored so that the size of the charge packets at every sensing site in the array would affect the decision as to when sensing should be terminated during any particular sampling period, i.e. when the sensing portion should terminate in a particular sample period or frame.

SUMMARY OF THE INVENTION

The present invention contemplates sampling outputs from each of a plurality of photodetectors in a frame and setting the time of sensing during the frame on the basis of a representation of the size of the outputs of these photodetectors considered jointly. The arrangement contemplates a number of photodetectors having a common electrode through which radiation can pass to reach an inner portion of each photodetector, this common electrode having a voltage applied thereto initially in a frame with the electrode thereafter monitored to determine the decay in the voltage from the value earlier applied in that frame. Upon determining a sufficient decay has occurred, the taking of a sample in that frame of the photodetector outputs will be terminated.

The signal processor of the above invention may be advantageously implemented in a charge-transfer device, particularly in a monolithic integrated circuit using charge-coupled devices. Photodetectors in such an arrangement can be conductor-insulator-semiconductor (CIS) photodetectors having the conductor in each as the common electrode, these photodetectors being adjacent to surface-channel charge-coupled devices in which the charge packets accumulated in the photodetectors can be transferred after charge accumulation due to impinging radiation, or sampling, is completed in each frame. The common electrode of the photodetectors has a switching means through which a voltage of a selected value can be applied thereto and a buffer means which can provide an indication of the amount of decay in the voltage occurring on the common electrode from that value of voltage applied thereto by the switching means. A determination means can be further provided which uses this indication as a basis for terminating the time duration of the taking of a sample in a frame.

DESCRIPTION OF THE PREFERRED EMBODIMENTS

Figure 1:
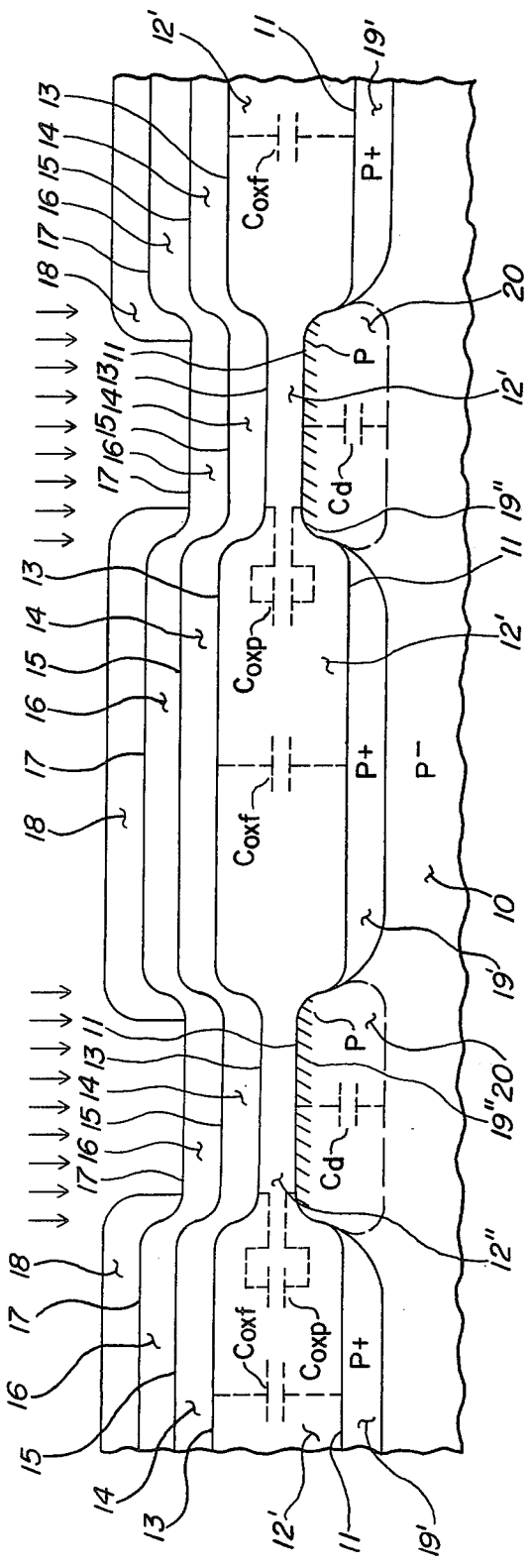
FIG. 1 shows a cross section view of a monolithic integrated circuit embodiment of the present invention.

FIG. 1 shows a cross section of a monolithic integrated circuit at a location therein where an array of conductor-insulator-semiconductor (CIS) photodetectors are fabricated. In this array, there is a plurality of CIS photodetectors, provided having a common conductor through which electromagnetic radiation can pass at the photodetector site to reach the semiconductor material below after passage through the insulating layer separating this conductor and the semiconductor material. The cross section of FIG. 1 is taken along a portion of this interconnected group of CIS photodetectors, more particularly, taken through the common conductor itself and the structure immediately therebelow.

A monolithic integrated circuit is formed in and on doped silicon serving as the semiconductor material base which is designated in FIG. 1 by the numeral 10. This base body of the semiconductor material, except for possible selected regions therein, is doped to have a p-type conductivity by the presence of boron atoms. The conductivity typically in the range of 9 to 13 $\Omega$-cm or approximately $1 \times 10^{15}$ boron atoms/cm$^3$.

The major surface, 11, of semiconductor material body 10 has formed thereon an insulating layer, 12. Insulating layer 12 is comprised of silicon dioxide and varies in width along major surface 11. Thus, in the field regions of the device, surrounding the photodetecting sites, the corresponding insulator layer portions are designated 12' while the feature portions of the device at which the photodetecting sites occur have the corresponding portion of insulating layer 12 designated 12". The thickness of the insulating layer in field region portions 12' is on the order of 6,700 Å while the thickness of the insulating layer in feature region portions 12" is on the order of 1,100 Å.

Insulating layer 12 also has a major surface, 13, upon which a doped polycrystalline silicon conductor, 14, is provided which serves as the electrode which is common to each of the CIS photodetectors, the electrode through which radiation to be sensed by the photodetectors passes at the sensing sites as earlier mentioned. The polycrystalline silicon forming electrode 14 is doped with phosphorus in sufficient concentration to lead to a sheet resistivity of 15 to 50 $\Omega/\square$ to render the polycrystalline silicon in electrode 14 conductive. Electrode 14 is 5000 Å thick.

Electrode 14 has a major surface, 15, upon which is formed a passivating insulating layer, 16. Layer 16 is also formed of silicon dioxide and has a thickness of 4000 Å.

Finally, layer 16 has a major surface, 17, upon which is formed an electromagnetic radiation barrier, 18, the barrier being aluminum which is impervious to light. The thickness of barrier 18 is 1.2 $\mu$m. Barrier 18 has openings at the photodetecting sites in the feature region of the device to permit light to pass through insulating layers 12" and 16 as well as through electrode 14 to impinge on semiconductor material 10 at these sites.

Also, to assure that there is no significant interaction because of voltage being applied to electrode 14 with semiconductor material 10 in the field regions, considerably higher conductivity regions, 19', are provided in semiconductor material 10 immediately below insulating layer regions 12'. These regions are doped also with boron to a concentration of $1 \times 10^{18}$ atoms/cm$^3$.

Finally, to influence the characteristics of the CID photodetectors, slightly higher conductivity regions, 19", are formed in semiconductor material 10 immediately below insulating layer regions 12". These regions are shown by short, diagonal lines in FIG. 1 with these regions being doped by boron atoms in a concentration of $2 \times 10^{15}$ atoms/cm$^3$. This leads to an inversion threshold at the sensing sites of approximately 0.5 volts.

The structure and the method of operation of the device shown in FIG. 1 leads to certain effective capacitances being experienced when the structure of FIG. 1 is operated in an electrical circuit. In typical operation, a voltage is applied between electrode 14 and semiconductor material body 10 which causes depletion regions, 20, to form in semiconductor material 10 at the photodetecting sites in the feature regions. These depletion regions are outlined by major surface 11 of semiconductor material 10 and by long dashed lines at the photodetecting sites in semiconductor material 10 which intersect major surface 11. Such depletion regions do not form under the field regions because of the substantially greater thickness of insulating regions 12' and because of the higher conductivity regions 19'. The value of the voltage applied to electrode 14 might typically be about 3.5 volts.

With this voltage applied to electrode 14, the impingement of electromagnetic radiation on the photodetecting sites leads to the accumulation of charge carriers, in this case electrons, in semiconductor material 10 at major surface 11 in the feature regions and within the depletion regions 20. Electromagnetic radiation in the form of light is represented in FIG. 1 by a horizontal series of vertical arrows directed toward the structure at the photodetecting sites and at the adjacent portions in the field regions. The electromagnetic radiation impinging above the field regions is blocked form reaching any further into the device of FIG. 1 by barrier 18. Thus, the applied voltage establishes a potential well at surface 11 in the feature region photodetecting sites into which electrons, generated by impinging radiation, are captured. The addition of the radiation induced electrons at the photodetecting sites as charge carriers reduces the depth of the potential well.

The accumulated radiation induced electrons or charge carriers form a charge packet in semiconductor material 10 at surface 11 in each photodetecting sites, this packet carrying, in the amount of charge therein, the information as to how much radiation has passed through the opening in barrier 18 and reached semiconductor material 10. The greater the intensity of the radiation reaching semiconductor material 10 at a photodetector site, the greater the amount of charge captured in the potential well in semiconducting material 10 at a site in a given amount of time. Again, this potential well is due to the resulting surface potential occurring at major surface 11 in depletion regions 20 in the feature region photodetecting sites, this surface potential being represented by sites by $\phi_s$ which depends on both electrode voltage 14, even though perhaps due at times to only the charge on the capacitances effectively connected thereto, and on the amount of accumulated radiation induced charge.

This situation at each photodetecting site can be represented by an equivalent capacitance, the depletion region capacitance, which is variable in value with the amount of voltage applied between electrode 14 and semiconductor body 10 and by the amount of radiation induced charge accumulated at major surface 11 in depletion region 20 in the feature region photodetecting sites. This depletion region capacitance is shown in dashed line form across depletion regions 20 at each photodetecting site in FIG. 1 and is designed by $c_d$.

The other capacitances present in the structure shown in FIG. 1, are only structure related and are not significantly affected by the applied voltage and the accumulated radiation induced charge carriers. These are the capacitances occurring between electrode 14 on one side of insulating layer 12 and semiconductor material 10 on the other side. In the feature region, such a capacitance occurs in series with the depletion region capacitance just discussed. This capacitance, designated $c_{oxp}$, is a capacitance occurring at photodetecting sites in the feature regions based on an oxide dielectric because of the presence of region 12" separating conductor 14 and semiconductor material body 10. The corresponding capacitance in the field regions, designated $c_{oxf}$, arises because of insulating region 12' separating electrode 14 and semiconductor material body 10. Capacitance $c_{oxp}$ is in series with capacitance $c_d$ which together are in parallel with the adjacent capacitance $c_{oxf}$ because of the common interconnection of the capacitances in series with $c_{oxf}$ by electrode 14 and semiconductor material 10. Due to the closely uniform results that come about from the fabrication methods used in manufacturing monolithic integrated circuits, these capacitances at each feature region photodetecting site and at each field region will be substantially equal in value to similar capacitance formed in the repeated, symmetrical structures occurring along the array portion having electrode 14 as a common electrode. Thus, each of these equivalent capacitances having the same subscript are substantially equal to one another.

Figure 2:
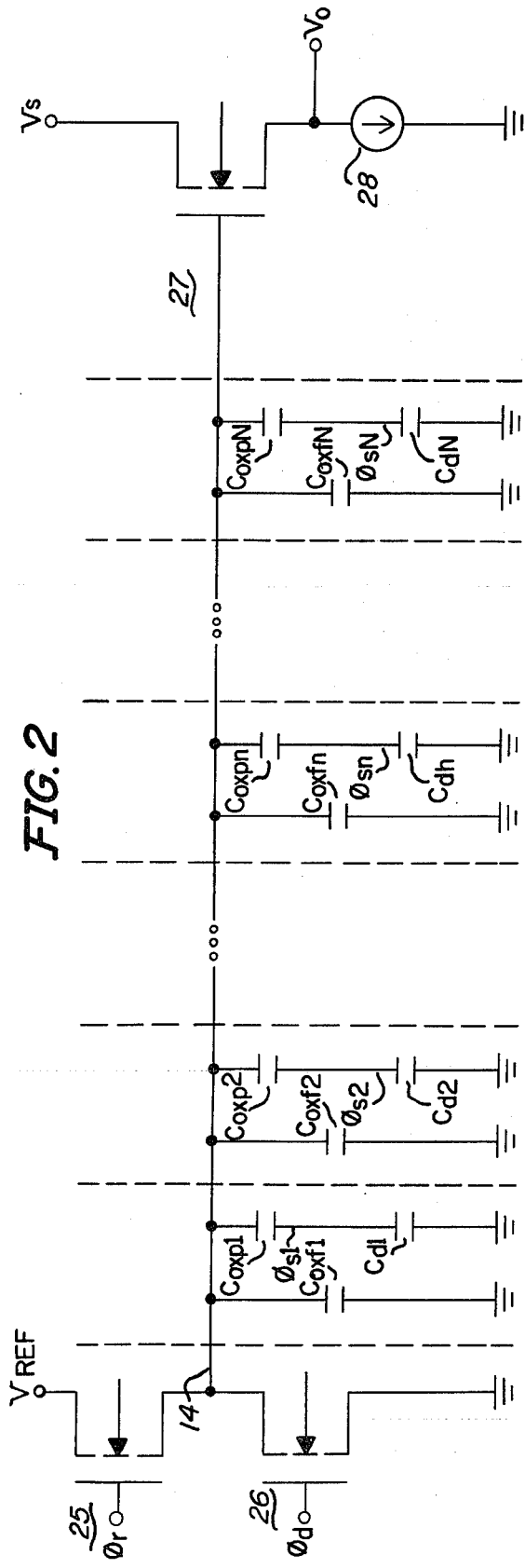
FIG. 2 shows an equivalent circuit schematic diagram of a larger portion of the monolithic circuit which includes that which is shown in FIG. 1.

The equivalent capacitances of FIG. 1 can be viewed as part of an equivalent circuit as shown in FIG. 2. Rather than having just two feature region photodetecting sites and all or portions of the three field regions shown in FIG. 1, the equivalent circuit of FIG. 2 assumes there will be several more photodetectors sharing common electrode 14. Thus, interconnection 14 in FIG. 2, which is equivalent to electrode 14 in FIG. 1 in the equivalent circuit, is shown in a manner to indicate that there is a total of N combinations of a feature region photodetecting site and allocated adjacent field regions in the full structure of which a part is shown in FIG. 1. That is, the equivalent capacitances for N such combinations are shown each connected to electrode 14 in FIG. 2.

The sides of the capacitances, which in FIG. 1 are shown connected to semiconductor material body 10, are indicated to be connected to ground in FIG. 2 assuming that semiconductor material body 10 of FIG. 1 is operated at the ground reference potential. Vertical dashed lines are used in FIG. 2 to set off each combination of feature region photodetecting site capacitance and associated allocated field region capacitance. The same capacitance designations are used in FIG. 2 as are used in FIG. 1 with the addition of a further number representation subscript. This last subscript is to indicate the position along electrode 14 of the particular combination of feature region photodetecting site capacitance and associated allocated field region capacitance.

Further shown in FIG. 2 connected to electrode 14 is the source of an enhancement mode, n-channel, insulated-gate field-effect transistor (IGFET), 25, which might be a metal-oxide-semiconductor (MOSFET), which has its drain connected to a reference voltage, $V_{REF}$, and its gate connected to a source of an operation directing signal, $\phi_r$. This arrangement permits a voltage to be provided at electrode 14 with respect to ground for establishing the depletion region at the feature region photodetecting sites. Voltage signal $\phi_r$ is a clock signal which establishes the beginning of a sampling period during which the photodetecting sites connected to electrode 14 are directed to effectively sample the electromagnetic radiation impinging thereat.

A further enhancement mode, n-channel IGFET, 26, is shown in FIG. 2 to have the drain thereof connected to electrode 14 and the source thereof connected to ground. A control signal, $\phi_d$ is provided to the gate of MOSFET 26 on those occasions when it is desired to have all of the photodetectors connected to electrode 14 rendered inoperative as transistor 26 can electrically connect electrode 14 to ground.

At the other end of electrode 14 there is shown connected in FIG. 2 a further enhancement mode, n-channel IGFET, 27, having its gate connected to electrode 14. The drain of transistor 27 is connected to a supply voltage, $V_S$, while the source of transistor 27 is connected to a current source load, 28. The other side of current source 28 is connected to ground. Current source 28, for instance, may be formed by a resistance or by another IGFET.

An output voltage, $V_o$, is supplied at the source of transistor 27. Output voltage $V_o$ will be shown in the following to provide an indication of the amount of radiation induced charge being accumulated at the various photodetector sites represented in FIG. 2. This will be shown for circumstances in which the voltage applied to electrode 14 through MOSFET 25 is only a voltage pulse during a frame, of a duration long enough to change the capacitances connected to electrode 14 but terminated during the actual taking of a sample in the frame or sampling period.

Also shown in FIG. 2 is the surface potential at each feature region photodetecting site as was shown to result in the discussion of the structure of FIG. 1. These surface potentials were indicated above by $\phi_s$ and will be so designated in FIG. 2 with the addition of a number representation subscript, i.e. $\phi_{sn}$, to indicate to which combination in FIG. 2 the surface potential representation pertains. In the typical design for the photodetecting sites in FIG. 1, the surface potential $\phi_{sn}$ will in general be large compared to the change in the surface potential, $\Delta\phi_{sn}$, due to radiation induced charge accumulating at the photodetecting site during the taking of a sample of the impinging radiation. Thus, to a first approximation the depletion capacitance $c_d$ can be viewed as being constant as it depends on the whole of the surface potential $\phi_{sn}$ present.

If the situation is considered first where the electromagnetic radiation impinging on each of the detectors is assumed to be identical, the various feature region capacitance branches connected between electrode 14 and ground in FIG. 2 can all be considered in parallel and to be identical so that they may be reduced to a single branch connected between electrode 14 and ground. Similarly, a single branch between electrode 14 and ground can be considered to represent a reduction of all of the field region capacitances. This reduced field region branch would have a single capacitance with value equal to direct sum of the values of all of the capacitances $c_{oxfn}$ from 1 to N. The other reduced branch, the feature region branch, would have a capacitance of a value equal to the direct sum of the values of all of the capacitances $c_{oxpn}$ from 1 to N in series with another capacitance having a value equal to the direct sum of the values of all of the capacitances $c_{dn}$ from 1 to N. The feature region capacitances can be reduced to this reduced branch form because the surface potential at each capacitance juncture between a capacitance $c_{oxpn}$ and a capacitance $c_{dn}$ from 1 to n will be the same due to the assumption of uniform electromagnetic radiation impingement on the detectors.

Then, using the well known relationship that the charge on a capacitance equals the value of the capacitance times the voltage on that capacitance, the following small signal equation can be written as a matter of conservation of charge:

$$\Delta\phi_s C_{eq(reduced\,\phi s\,node)} = \Delta\phi = \Delta V_{14} C_{eq(reduced\,electrode\,14\,node)},$$

That is to say, the change in the charge across a capacitance connected to one node in the reduced branch circuit must equal the change in charge across the capacitance connected to the other node in the reduced branch circuit.

The above relationship can be rewritten in the following manner to provide the change in voltage on electrode 14 as a function of the change in surface potential as follows:

$$\Delta V_{14} = \frac{C_{eq(reduced\,\phi s\,node)}}{C_{eq(reduced\,electrode\,14\,node)}} \Delta\phi_s = K\Delta\phi_s$$

The values for the equivalent capacitances occurring at each of the two nodes in the reduced branch circuit can be found from circuit theory to be $$C_{eq(reduced\,\phi s\,node)} = \frac{\sum_n c_{oxpn} \sum_n c_{oxfn}}{\sum_n c_{oxpn} + \sum_n c_{oxfn}} \sum_n c_{dn},$$

$$C_{eq(reduced\,electrode\,14\,node)} = \frac{\sum_n c_{oxpn} \sum_n c_{dn}}{\sum_n c_{oxpn} + \sum_n c_{dn}} \sum_n c_{oxfn}.$$

Dropping the constraint of equal surface potential changes each photodetector by virtue of the assumption of uniform electromagnetic radiation impinging on them all, linear circuit theory, with its superposition principle, and the second equation set out above allows the conclusion that the change in voltage occurring on electrode 14 because of radiation impinging on the photodetectors will be equal to the sum of the individual changes in the surface potential at each photodetector weighted by the factor K, as defined above, a result which can be written $$\Delta V_{14} = K \sum_n \Delta\phi_{sn}.$$

The change in surface potential at any particular detector is equal to the radiation induced charge developed there divided by the equivalent capacitance occuring at the photodetector. Thus, the change in surface potential at any particular photodetector can be written as follows:

$$\Delta\phi_{sn} = \frac{Q_n}{C_{eq(individual\,\phi s\,node)n}} = \frac{qN_{(rad\,ind\,electrons)n}}{C_{eq(individual\,\phi s\,node)n}},$$

where q is equal to the electronic charge and N(rad ind electrons)n is equal to the number of electrons induced by the radiation impinging on photodetector n. The equivalent capacitance occurring at a photodetector node n can be found from circuit theory to be the equivalent of capacitance $c_{dn}$ in parallel with the series combination of $C_{oxpn}$ and all of the other capacitance branches connected to electrode 14 in FIG. 2 taken in parallel, or $$C_{eq(individual\,\phi s\,node)n} =$$
$$\frac{c_{oxpn}[c_{oxfn} + (N-1)C_{eq(reduced\,electrode\,14\,node)}]}{c_{oxpn} + c_{oxfn} + (N-1)C_{eq(reduced\,electrode\,14\,node)}} + c_{dn}.$$

As a result, the change in voltage on electrode 14 due to radiation impinging on the photodetectors interconnected thereby becomes, assuming the equivalent capacitances at each individual node are equal because of uniform processing, the following:

$$\Delta V_{14} = \frac{K}{C_{eq(individual\,\phi s\,node)}} \sum_n Q_n.$$

As can be seen from the equation of this last result, the total change in the voltage on electrode 14, due to radiation induced charge accumulating in the various photodetectors, is a function of the average charge being accumulated in each photodetector due to radiation impinging thereon, i.e. the size of the charge packet being accumulated, times a constant.

While the foregoing is a somewhat approximate analysis, the results indicate that the average of the size of the accumulating charge packets due to impinging radiation can be successfully determined by monitoring the voltage appearing on electrode 14 in FIG. 2 after the capacitances tied to electrode 14 have been charged to a selected value through transistor 25. At the termination of this charging of the capacitances connected to electrode 14 through transistor 25, resulting in a voltage on electrode 14 equal to $V_{REF}$, the voltage on electrode 14 will decay as charge accumulates in the photodetectors due to impinging radiation. This decay can be noted by observing voltage $V_o$ at the output of transistor 27 driving current source 28 in a source follower configuration. When voltage $V_o$ has decreased to a sufficiently small value, the observer of this voltage knows that the average size of the charge packets accumulating under the photodetectors connected to electrode 14 has increased to a sufficiently large value indicating that the current taking of a sample in the current frame should be terminated.

Figure 3:
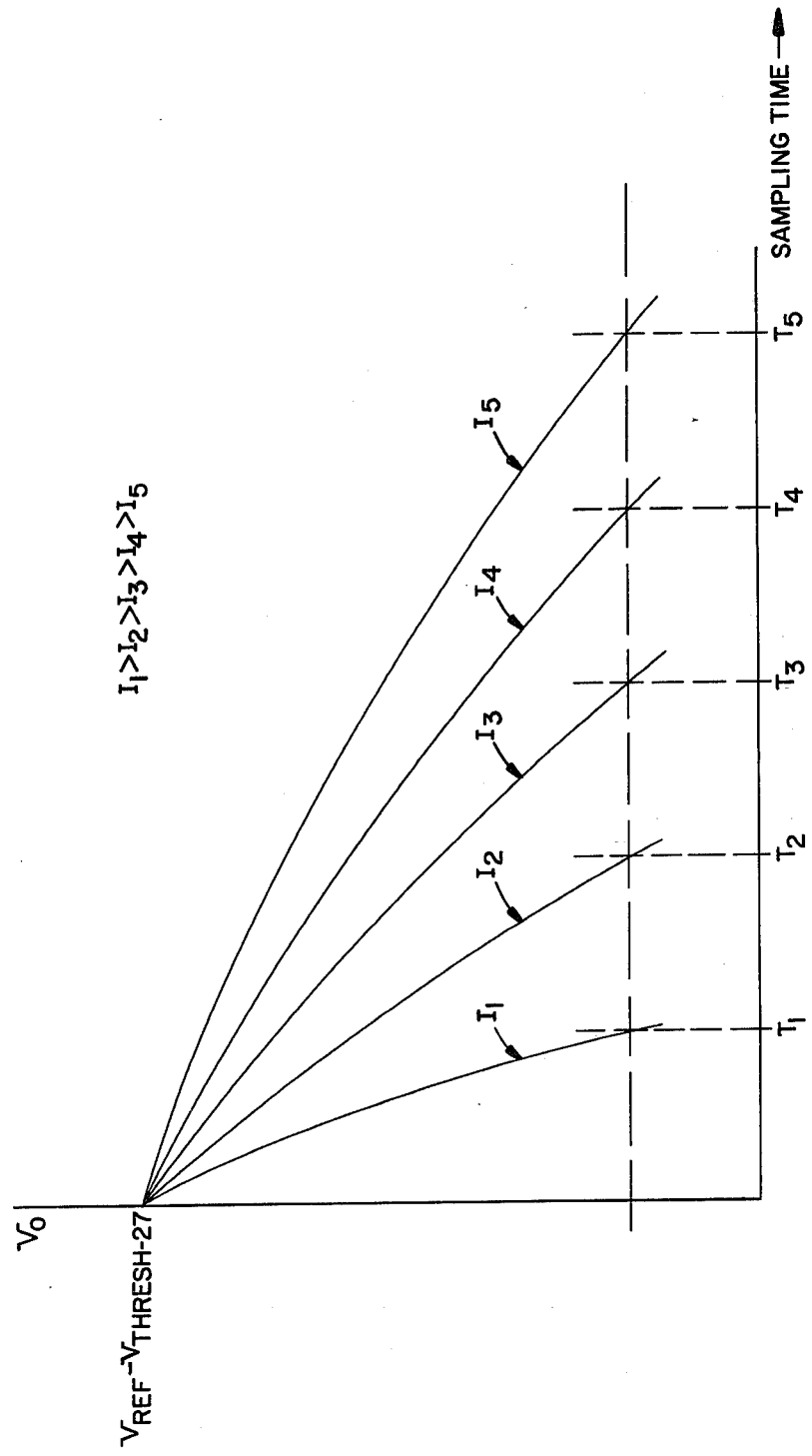
FIG. 3 is a graph showing selected performance characteristics of the circuit diagrammed in FIG. 2.

This can be seen in FIG. 3 where $V_o$ has been plotted as a function of sampling period time. Thus, when the capacitances connected to electrode 14 have been charged from voltage source $V_{REF}$ through transistor 25 so that the output voltage $V_o$ appears to equal $V_{REF} - V_{THRESH-27}$, and transistor 25 is switched into the "off" condition, the voltage on electrode 14 will begin to decay as will be reflected in output voltage $V_O$. As shown in FIG. 3, higher intensities of electromagnetic radiation impinging on the photodetectors connected to electrode 14 will lead to a relatively short period of time for the voltage on electrode 14 to reach a selected voltage level represented by a dashed line in FIG. 3. Conversely, lower intensities of electromagnetic radiation will lead to longer times before the voltage on electrode 14 reaches the same dashed-line represented voltage level. Thus, by selecting a particular voltage level as representing the desired maximum size of the average charge packet accumulating in the photodetectors connected to electrode 14, the sampling time in a frame will be determined at which point sampling is to be terminated. Thereafter, the accumulated charge packets are to be transferred out of the photodetectors where accumulated for further processing and the photodetectors prepared for a new sampling of the impinging electromagnetic radiation.

Figure 4:
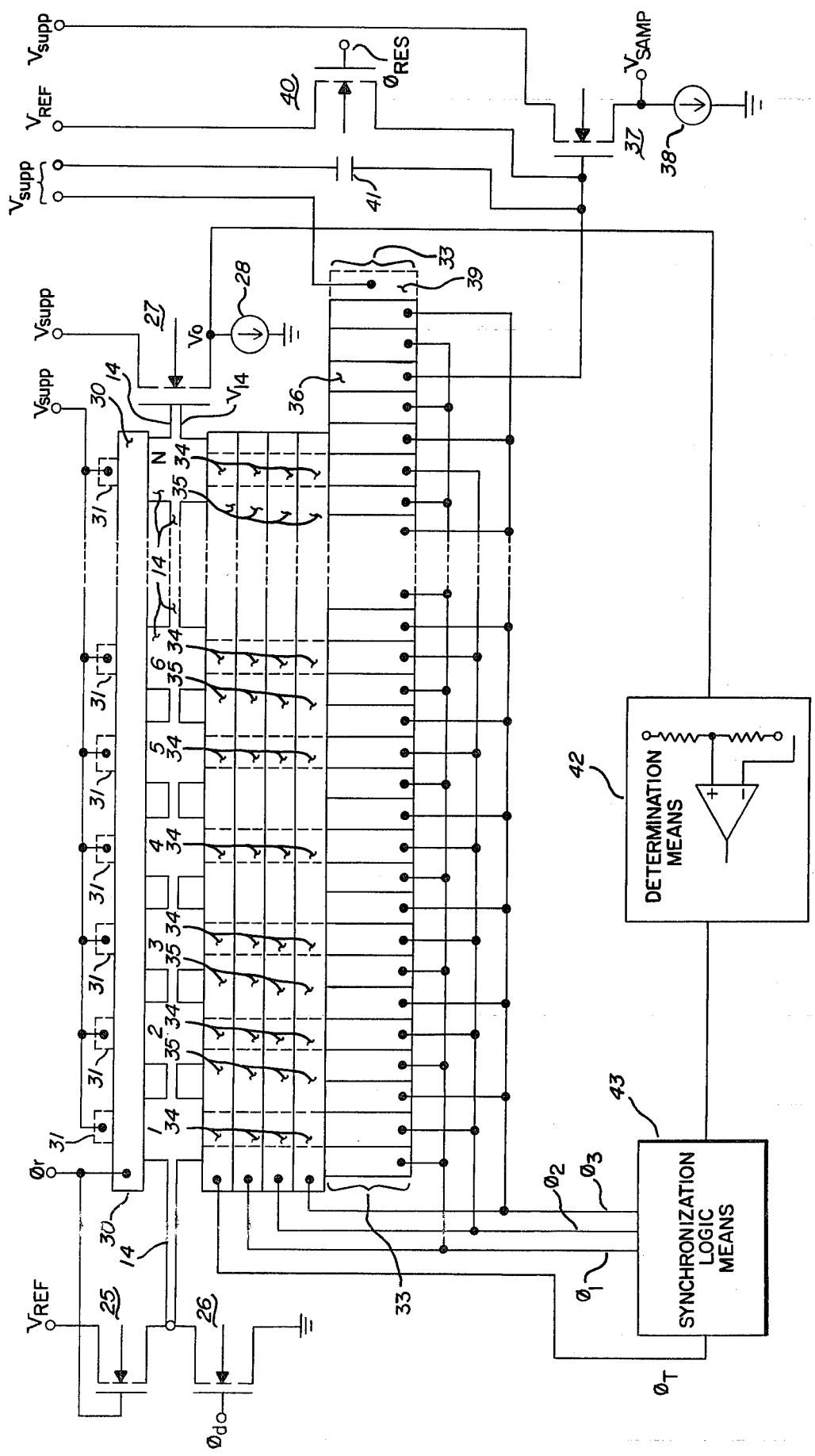
FIG. 4 is a system schematic diagram of a monolithic integrated circuit associated with FIGS. 1 and 2 having further system portions further embodying the present invention.

FIG. 4 discloses a system layout in schematic form for operating the structure of which a part is shown in FIG. 1 and which is described in the associated discussion above including the portions relying on FIGS. 2 and 3. System components in FIG. 4 corresponding to those shown in FIG. 2 have been similarly designated in FIG. 4 as they were in FIG. 2. Thus, to the left in FIG. 4 appear again transistors 25 and 26 connected to electrode 14. Electrode 14, shown in FIG. 4 as doped polycrystalline silicon of varying width, connects and forms part of photodetectors 1 through N where each of these photodetectors represents an enlarging at its site of electrode 14, i.e. over the feature region. Electrode 14 narrows to form the interconnection portion between the photodetector sites, i.e. over the field region.

To the right in the system of FIG. 4, electrode 14 is connected to the gate of transistor 27, just as in FIG. 2. Again, transistor 27 drives current source 28.

Transistors 25 through 27 are shown in electrical schematic form even though the structure shown between transistors 25 and 26, on the left, and transistor 27, on the right, is shown as a schematic indication of the top view of a monolithic integrated circuit chip. Transistors 25 through 27 would also be fabricated in the monolithic integrated circuit chip in practice. They could have also been shown in the chip top view, but are shown in electrical schematic form for ease of understanding of the system of FIG. 4.

Further shown in FIG. 4 is a doped polycrystalline silicon reset gate, 30, immediately adjacent the photodetectors 1 through N as interconnected by electrode 14. On the side of reset gate 30 opposite that along which photodetectors 1 through N occur is shown a series of diffused regions, 31, occurring in the semiconductor material body that is below and supporting reset gate 30 through an insulating layer of silicon dioxide. Diffused regions 31 are shown by dashed lines. Each of these regions 31 together with gate 30 form effectively in operation an IGFET at each photodetector site, these transistors all having a commonly connected gate region as provided by gate 30. The diffused regions 31 are all electrically connected to a voltage supply, $V_{SUPP}$, and gate region 30 is connected to the same operating voltage source $\phi_r$ as is the gate of transistor 25.

This arrangement permits electrode 14 and the effective capacitances connected thereto to be charged to the voltage $V_{REF}$ while simultaneously removing any radiation induced charge that may have accumulated in the CIS photodetectors at sites 1 through N prior to or during the application of $V_{REF}$. This removal is accomplished by transferring such charge from each of the photodetector sites 1 through N under gate 30 to the corresponding one of regions 31 and thence to the voltage supply supplying voltage $V_{SUPP}$.

Again, transistor 26 has an operating voltage $\phi_d$ applied thereto to permit electrically connecting electrode 14 to ground during times when there is the desire to introduce no additional noise into the major signal transfer shift register, 33, from photodetectors 1 through N via input transfer shift registers, 34. This might be desired, for instance, in the situation where main shift register 33 is arranged to have a further array of photodetectors transfer charge packets thereto for readout at times alternative to the times of transfers from the photodetectors interconnected by electrode 14.

As shown in FIG. 4, main signal shift register 33 has been provided as a three phase charge-coupled device arrangement. Typically, this will be a surface channel charge-coupled device but it could also be a burried channel charge-coupled device. In any event, three electrodes in shift register 33 are shown associated with each photodetector site and its corresponding input shift register 34, these electrodes being of doped polycrystalline silicon.

Input shift registers 34 are separated and electrically isolated from one another by channel stop regions, 35, which also each isolate portions in main signal shift register 33 from the adjacent input shift registers 34. Of course, there are also other channel stop regions occurring around shift registers 33 and 34 but these will not be indicated further. These channel stop regions are provided by doping regions near the major surface of the semiconductor material to have a p+- type conductivity at the locations desired for such stops.

Input shift registers 34 are provided by three doped polycrystalline silicon electrodes common to each input shift register to N form three phase, single stage shift register. A fourth electrode is also provided, common to each input shift register 34, serving as a transfer gate to direct the transfer of charge accumulated in photodetectors 1 through N to each corresponding input shift register 34, and ultimately into main signal shift register 33 for readout of these charge packets.

In operation, a charge packet from each of the photodetectors 1 through N is simultaneously transferred into its corresponding input shift register during a frame, and then each packet is simultaneously transferred into main signal shift register 33. The charge packets in main signal shift register 33 are transferred to the right during the frame and reach the resettable floating gate output arrangement provided at the end of main signal shift register 33.

In this output arrangement, a floating gate, 36, is connected to the gate of an output IGFET, 37, operated as a source follower driving a current load means, 38, connected between the source of transistor 37 and ground. Charge packets, transferring to the right in main signal shift register 33 as indicated above, pass under floating gate 33 as indicated above, leading to a voltage, $V_{SAMP}$, being available across current load means 38 at the source of transistor 37.

The charge packets continue to shift along in main signal shift register 33 to reach a diffusion, 39, shown in dashed lines at the end of this shift register. This diffusion is connected to the supply voltage $V_{SUPP}$ through which the charge packets are dissipated. Further components in the resettable floating gate output arrangement are another IGFET, 40, and the capacitance, 41. The operation of all of these components at the end of main signal shift register 33 in the resettable floating gate output arrangement are well known and will not be further discussed here.

The remaining portions of the system shown in FIG. 4 are present for generating a pulse $\phi_T$ for operating the transfer gate common to all of the input shift registers 34. Thus, $\phi_T$ signals the end of the taking of a sample and provides for the transfer of those charge packets accumulated in this sampling under each of the photodetectors 1 through N. To generate $\phi_T$, voltage $V_o$ at the output of IGFET 27 is supplied to a determination means, 42. Determination means 42 provides a determination of when voltage $V_o$ has decayed sufficiently far, i.e. reached the horizontal dashed line as shown in FIG. 3, to thereby indicate that the average charge packet in photodetectors 1 through N has grown sufficiently large such that sampling in a particular frame is to be terminated. As indicated within the box 42, the determination means can, in many instances, be as simple as providing a comparator having one side thereof connected to a reference voltage representing the desired voltage along the horizontal line in FIG. 3 while the other input side of the comparator simultaneously receives voltage $V_o$.

The output of the determination means will be a voltage level shift applied to a synchronization logic means, 43, which reacts by providing a pulse in the $\phi_T$ waveform which is synchronized with the waveform pulses operating the shift registers, $\phi_1$, $\phi_2$, and $\phi_3$. This synchronization is necessary to coordinate the transfer of charge from each of the CIS photodetectors with the shifting sequence in the input shift registers 34 so that the charge packets are properly transferred from the photodetectors into these input shift registers.

Figure 5:
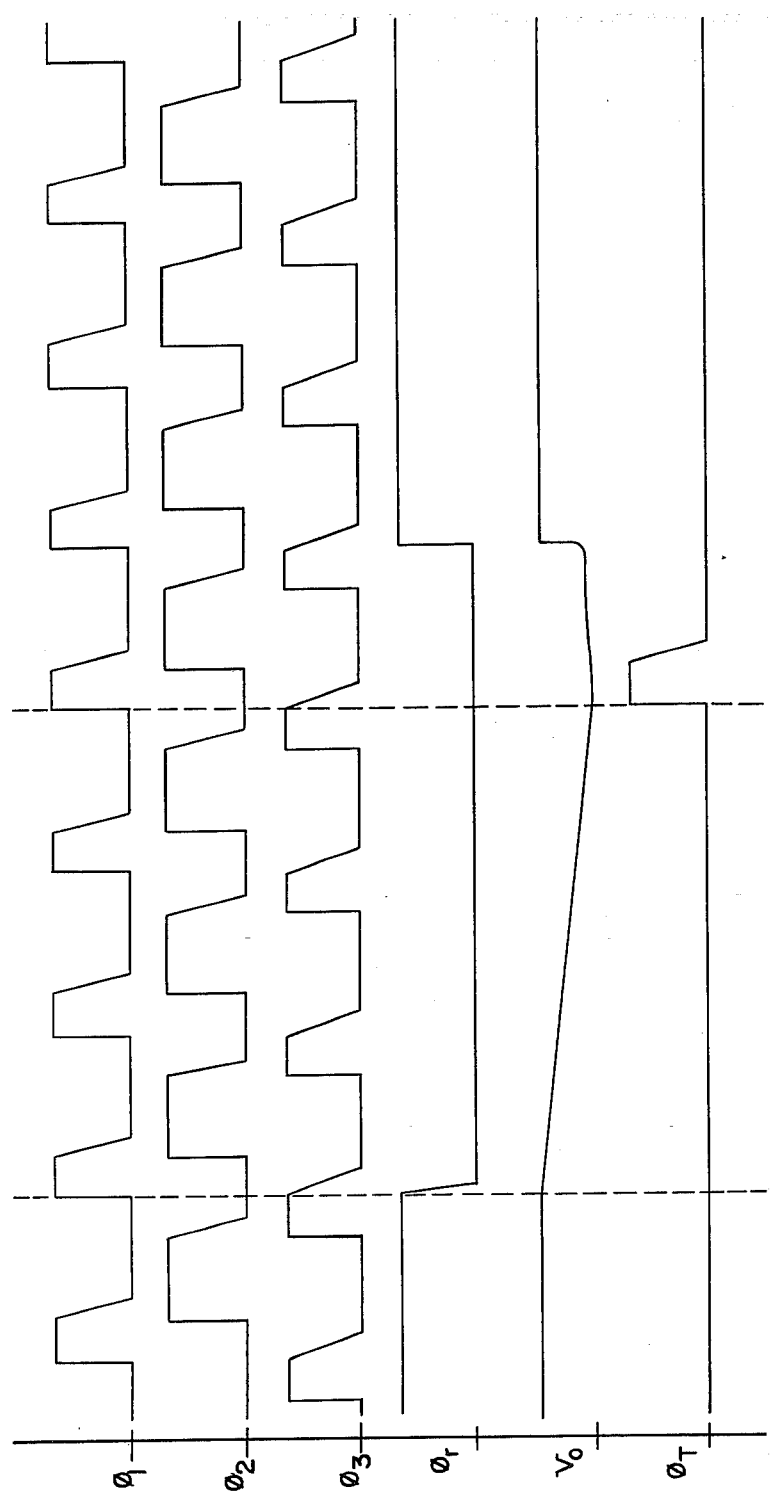
FIG. 5 is a graph showing several signals occurring in the system diagrammed in FIG. 4.

The operation of the system of FIG. 4 can be seen in summary in the waveforms presented in FIG. 5. The first three waveforms represent the shift register operating voltages, $\phi_1$, $\phi_2$, and $\phi_3$. The next waveform down in FIG. 5 represents the control voltage waveform $\phi_r$ which is applied to the gate of MOSFET 25 thereby directing that the CIS photodetectors interconnected by electrode 14 be charged to the voltage value $V_{REF}$. The first vertical dashed line in FIG. 5 indicates where the taking of a sample begins coinciding with the ending of the $\phi_r$ pulse controlling transistor 25 and which beings a frame. From this first vertical dashed line in FIG. 5 on, voltage $V_o$ at the output of transistor 27 beings to decay from the value $V_{REF}-V_{THRESH-27}$ as average charge packet in the photodetectors 1 through N begins to increase in response to the electromagnetic radiation impinging on the photodetectors.

At some point voltage $V_o$ will have decreased sufficiently such that determination means 42 will provide a rising voltage to synchronization logic means 43. As a result, a pulse in waveform $\phi_T$ is provided when the next pulse in waveform $\phi_1$ occurs, as can be seen in FIG. 5, to begin the transfer of charge packets accumulated in photodetectors 1 through N into the corresponding input shift registers 34. Thereafter, $\phi_r$ again returns to a high state to direct transistor 25 to provide voltage $V_{REF}$ to electrode 14, and to the photodetectors interconnected thereby, to begin another frame.

Thus, there is provided a method for sensing the average amount of the charge packets accumulating in the interconnected photodetectors due to impinging electromagnetic radiation at the very time these charges are accumulating. Hence, no additional time in a frame need be allowed for various sensing and signal processing manipulations to determine what the average charge packet size is after the sampliing period is over. Nor is there any need for providing additional photodetectors outside the interconnected array for the purpose of making a determination of charge packet size occuring by virtue of the accumulating of charge packets in the array due to impinging radiation.

Note that the remaining circuit components in FIG. 4 can also be integrated in the same monolithic integrated circuit chip in which main signal shift register 33 and input shift register 34 are fabricated. That is, the entire system can be, as indicated above, conveniently provided in the same monolithic integrated circuit chip as the photodetectors themselves are provided in. However, in some situations, there may be advantages to not including all the system shown in FIG. 4 in the same chip.

Several such photodetector arrays along several corresponding common electrodes, and the associated shift registers, can be provided to form an extended two-dimensional array in a monolithic integrated circuit chip if desired. Further, more than one such photodetector array on a chip can be served by a single main signal shift register with each array having input shift registers leading to such a main shift register.

The embodiments of the invention in which an exclusive property or right is claimed are defined as follows:

1. A sensor and sensor signal processor device having a plurality of sensing sites at which electromagnetic radiation can be sensed and signals therefrom derived, said device comprising:

a semiconductor material body of a first conductivity type except in selected regions thereof, with said semiconductor material body having a first major surface;

a plurality of input charge-transfer devices each of which has therein at least a first storage well electrode, and each said input charge-transfer device storage well electrode being spaced apart from said first major surface by a first electrical insulating layer;

a first sensor electrode having therein a plurality of selected regions with each said selected region separated from those selected regions adjacent thereto in said first sensor electrode by at least one joining region also provided in said first sensor electrode, each said first sensor electrode selected region being immediately adjacent to one of said input charge-transfer device first storage well electrodes such that transfers of electrical charge can be directed therebetween, and each said first sensor electrode selected region and each said first sensor electrode joining region being spaced apart from said first major surface by a second electrical insulating layer, said first sensor electrode selected regions being at least at some of said electromagnetic radiation sensing sites;

a first switching means having first and second terminating regions and having a control region therein by which said first switching means is capable of being directed to effectively provide a conductive path of a selected conductivity between said first switching means first and second terminating regions, said first switching means first terminating region being electrically connected to a first terminal means adapted for electrical connection to a first electrical energization means, said first switching means second terminating region being electrically connected to said first sensor electrode; and a first buffer means having an output and a high impedance input, said first buffer means input being electrically connected to said first sensor electrode, said first buffer means being capable of providing a representation at said output thereof of any voltage occurring at said input thereof whereby an indication of voltage occurring on said first sensor electrode can be provided in response to selected electromagnetic radiation impingement occurring therethrough at said electromagnetic radiation sensing sites.

2. The apparatus of claim 1 wherein said first sensor electrode joining regions are spaced further from said semiconductor material body first major surface than are said first sensor electrode selected regions by said second electrical insulating layer.

3. The apparatus of claim 2 wherein said semiconductor material body is doped in larger concentrations near said first major surface at locations across said second insulating layer from said first sensor electrode joining regions than is said semiconductor material body near said first major surface at locations across said second insulating layer from said first sensor electrode selected regions.

4. The device of claim 2 wherein said first sensor electrode, on a surface thereof opposite that surface closest to said semiconductor material body, is at least partially covered with a blocking material capable of preventing electromagnetic radiation from reaching said first sensor electrode, said blocking material having openings therein exposing said first sensor electrode selected regions such that any impinging electromagnetic radiation could reach these regions.

5. The apparatus of claim 1 wherein said input charge-transfer devices in said plurality thereof are each surface channel charge-coupled devices.

6. The device of claim 1 wherein said first sensor electrode, on a surface thereof opposite that surface closest to said semiconductor material body, is at least partially covered with a blocking material capable of preventing electromagnetic radiation from reaching said first sensor electrode, said blocking material having openings therein exposing said first sensor electrode selected regions such that any impinging electromagnetic radiation could reach these regions.

7. The apparatus of claim 1 wherein each said input charge-transfer device storage well electrode in one of said input charge transfer devices being immediately adjacent to at least one other one therein such that transfers of electrical charge can be directed therebetween, but being immediately adjacent to a maximum of two other such storage well electrodes therein, said input charge-transfer devices loading to a common charge-transfer device shift register capable of being directed to receive electrical charge from said input charge-transfer devices and of shifting any received electrical charge therealong.

8. The apparatus of claim 1 wherein said first switching means and said first buffer means are each enhancement mode, insulated-gate field-effect transistors, said first switching means first and second terminating regions being drain and source regions, respectively, and said first switching means control region being a gate region, said first buffer means input being a gate region.

9. The apparatus of claim 8 wherein said semiconductor material body is doped in larger concentrations near said first major surface at locations across said second insulating layer from said first sensor electrode joining regions than is said semiconductor material body near said first major surface at locations across said second insulating layer from said first sensor electrode selected regions.

10. The apparatus of claim 8 wherein each said input charge-transfer device storage well electrode in one of said input charge transfer devices being immediately adjacent to at least one other one therein such that transfers of electrical charge can be directed therebetween, but being immediately adjacent to a maximum of two other such storage well electrodes therein, said input charge-transfer devices loading to a common charge-transfer device shift register capable of being directed to receive electrical charge from said input charge-transfer devices and of shifting any received electrical charge therealong.

11. The apparatus of claim 9 wherein said semiconductor material body is of doped silicon, said first sensor electrode and each said input charge-transfer device first storage well electrode are of doped polycrystalline silicon, said first and second insulating layer being a common insulating layer of silicon dioxide which also provides the oxide layer between said gate regions and said semiconductor material body for said insulated-gate field-effect transistors serving as said first switching means and as said first buffer means with said first switching means source and drain and said first buffer means source being formed in said selected regions of said semiconductor material body which are of a second conductivity type.

12. The apparatus of claim 11 wherein said first sensor electrode joining regions are spaced further from said semiconductor material body first major surface than are said first sensor electrode selected regions by said second electrical insulating layer.

13. The device of claim 11 wherein said first sensor electrode, on a surface thereof opposite that surface closest to said semiconductor material body, is at least partially covered with a blocking material capable of preventing electromagnetic radiation from reaching said first sensor electrode, said blocking material having openings therein exposing said first sensor electrode selected regions such that any impinging electromagnetic radiation could reach these regions.

14. The device of claim 11 wherein said first buffer means output is a source region in said field-effect transistor serving as said first buffer means.

15. A method for sensing electromagnetic radiation at selected sites in a device and for deriving signals representative of that which is sensed at these sites, said device having a semiconductor material body of a first conductivity type except in selected regions thereof with said semiconductor material body having a first major surface, said device having a first sensor electrode which is adjacent said first major surface at least at a plurality of said electromagnetic radiation sensing sites, said device also having a plurality of detector signal transfer devices arrayed along said first sensor electrode such that there is a detector signal transfer device immediately adjacent to at least each of said plurality of electromagnetic radiation sites which is capable of receiving representations of that which is sensed at such a site, said method comprising:

providing, for a first selected duration, a voltage of a selected value between said first sensor electrode and at least that portion of said semiconductor material body at said plurality of electromagnetic radiation sites and subsequently, for a selected second duration, eliminating any significant conductive paths connected to said first sensor electrode;

monitoring those values of voltage occurring between said first electrode sensor and said semiconductor material body during said second selected duration while simultaneously permitting said electromagnetic radiation to impinge on said sensing sites; and in sequence, repeating each of said preceding steps a selected number of times beginning with providing a voltage of said selected value between said first sensor electrode and said semiconductor material body for a said first duration after that immediately preceding said second duration is past.

16. The method of claim 15 wherein said monitoring further comprises:

determining when there has been a sufficient change in value of that voltage occurring on said first electrode sensor during said selected second duration and providing a determination signal on that occurrence to indicate termination of said second selected duration; and transferring charge from said sensing sites accumulated because of impinging electromagnetic radiation thereon to said detector signal transfer devices after said determination signal occurs.

17. The method of claim 16 wherein said first sensor electrode is part of a conductor-insulator-semiconductor (CIS) photodetector present at each of said radiation sensing sites.

18. The method of claim 16 wherein said transferring of charge is accomplished by a charge-coupled device leading from each of said sensing sites.

19. A method of claim 16 wherein said providing of a voltage of a selected value was accomplished by use of an enhancement mode, insulated-gate field-effect transistor connected between said first sensor electrode and an interconnection means adapted for electrical connection to an electrical energization source, and said monitoring of said first electrode sensor is accomplished at least in part by an enhancement mode, insulated-gate field-effect transistor having a gate region thereof connected to said first sensor electrode.

20. The method of claim 17 wherein said transferring of charge is accomplished by a charge-coupled device leading from each of said sensing sites.

21. The method of claim 20 wherein said charge-coupled devices each lead to a common charge-coupled device shift register which receives charge from said charge-coupled devices leading from said sensing sites.

22. The method of claim 18 wherein said charge-coupled devices each lead to a common charge-coupled device shift register which receives charge from said charge-coupled devices leading from said sensing sites.

* * * * *